United States Patent [19]

Tanimura

[11] Patent Number: 5,146,428
[45] Date of Patent: Sep. 8, 1992

[54] SINGLE CHIP GATE ARRAY

[75] Inventor: Nobuyoshi Tanimura, Mitaka, Japan

[73] Assignee: Hitachi, Ltd., Tokyo, Japan

[21] Appl. No.: 804,637

[22] Filed: Dec. 10, 1991

Related U.S. Application Data

[63] Continuation of Ser. No. 473,601, Feb. 1, 1990, abandoned.

[30] Foreign Application Priority Data

Feb. 7, 1989 [JP] Japan .................................. 1-27835

[51] Int. Cl.$^5$ .............................................. G11C 5/06
[52] U.S. Cl. ................................. 365/189.08; 365/51;
365/63; 365/189.05; 365/230.03
[58] Field of Search ............... 365/51, 63, 189.05,
365/230.03, 230.08, 189.08; 357/42, 45

[56] References Cited

U.S. PATENT DOCUMENTS

| | | | |
|---|---|---|---|
| 4,675,849 | 7/1987 | Kinoshita | 365/189.08 |
| 4,724,531 | 2/1988 | Angleton et al. | 365/190 |
| 4,731,758 | 3/1988 | Lam et al. | 365/189.05 |
| 4,737,933 | 3/1988 | Chiang et al. | 365/230.08 |
| 4,791,607 | 12/1988 | Igarashi et al. | 365/230.08 |
| 4,825,414 | 4/1989 | Kawata | 365/189.05 |
| 4,855,958 | 8/1989 | Ikeda | 365/189.08 |
| 4,945,513 | 7/1990 | Ueda | 365/51 |

FOREIGN PATENT DOCUMENTS

62-88336 4/1987 Japan .

OTHER PUBLICATIONS

Sawada et al., *IEEE 1988 Custom Integrated Circuits Conference*, "A 72K CMOS Channelless Gate Array with Embedded 1Mbit Dynamic RAM", 1988 pp. 20.3.1–20.3.4.

*Primary Examiner*—Joseph E. Clawson, Jr.
*Assistant Examiner*—Jack A. Lane
*Attorney, Agent, or Firm*—Fay, Sharpe, Beall, Fagan, Minnich & McKee

[57] ABSTRACT

A gate array integrated circuit on a single chip has a standardized memory cell array, in a matrix, and a plurality of basic cells constituting a gate array unit. The integrated circuit is standardized as to its interconnections except for the basic cells constituting the gate array and other components, such as input/output buffers associated with an application specific wiring of the basic cells of the gate array. Connection between the gate array unit and the memory cell array is through a data register and switching circuit that can buffer data and arrange for the transfer of data at a selected data width up to the number of bits in a word line of the memory cell array, to provide for sufficient independence of the memory cell array and all of its necessary circuitry from the specific application wiring of the gate array unit, so that the memory cell array may be standardized.

18 Claims, 6 Drawing Sheets

SINGLE CHIP GATE ARRAY

This application is a continuation of application Ser. No. 07/473,601, filed Feb. 1, 1990 now abandoned.

BACKGROUND

The present invention relates to a gate array semiconductor integrated circuit having a memory function and a manufacturing method applicable to a semiconductor integrated circuit for data processing.

The gate array method may be employed to more cheaply manufacture various kinds of semiconductor integrated circuits in small quantities in a short period of time. The gate array method is designed to obtain a semiconductor integrated circuit having a desired individual function by providing a diffused wafer (diffused gate array wafer), having basic cells disposed on a semiconductor substrate with cell-to-cell wiring in accordance with user specification by means of an individual mask pattern. There has developed a demand for the gate array having logical cells such as gates and flip flops to be provided with a memory function such as a RAM (Random Access Memory) and a ROM (Read Only Memory) as integration and circuit scale therein increase. Although it is possible to form a memory structure by utilizing the logical cell such as latching in the gate array, this method of forming a large scale memory is disadvantageous in that production efficiency is extremely deteriorated. This gate array semiconductor integrated circuit may include a memory such as dynamic RAM. According to the art described in CICC (Custom Integrated Circuits Conference) issued by IEEE, 1988, for instance, a gate array semiconductor integrated circuit may contain dynamic RAM having a capacity of 1 Mbit. The dynamic RAM in this case is designed to input and output data on an 8-bit basis.

SUMMARY

For the gate array semiconductor integrated circuit to individually satisfy versatile user demand specifications, the structure and utilization method of the memory in the circuit as demanded by users tend to become versatile. If a memory with a solid number of data input-output bits is simply standardized inclusively, it is hardly possible to deal with versatile user demands individually. When a data processing semiconductor integrated circuit is arranged after the gate array method, for instance, the user demand cannot readily be satisfied if the data input-output unit of the built-in memory is fixed to 8 bits even though the barrel shift, relative to the data equivalent to one word line in the memory or parallel data processing for increasing data processing speed is attempted.

An object of the present invention is to provide a gate array semiconductor integrated circuit and manufacturing method thereof capable of readily answering for versatile demands on memory functions.

Another object of the present invention is to provide a gate array semiconductor integrated circuit and manufacturing method thereof capable of satisfying a demand for improving data processing capability by utilizing memory functions.

These and other objects, and novel features will become more apparent, as the description proceeds when considered with the accompanying drawings.

A data register, coupled to bit lines of a memory cell array having a plurality of memory cells disposed in the form of a matrix and capable of storing data equivalent in bit length to substantially one word line of the memory cell array, is directly coupled to a gate array unit by means of a group of signal lines to form a semiconductor integrated circuit.

In the aforementioned gate array unit, a standardized switch circuit may be formed to select what is desired from the group of signal lines connected to the data register. Moreover, it is possible to standardize control signals for providing access to memory cells included in the memory cell array by coupling the control means to the gate array unit by means of the group of signal lines.

A method for producing the semiconductor integrated circuit, which is basically intended to satisfy user demand specification by forming basic cell-to-cell wiring arranged orderly on the semiconductor integrated circuit by means of a mask pattern, comprising the steps of making solidly in structure a memory cell array having a plurality of memory cells disposed in the form of a matrix and a data register coupled to bit lines of the memory cell array and capable of storing data equivalent in bit length to substantially one word line of the memory cell array and the whole or part of a gate array unit coupled to the data register by means of a group of signal lines.

According to the aforementioned means, the structure is a solid structure in which the data register capable of storing data having bits corresponding to one word line of the memory cell array, is directly coupled to the gate array unit relative to the individual structure of the gate array unit. This increases freedom in selecting the function of parallel or partial processing data about one line of the memory cell array in compliance with the individual function desired in the gate array unit. As a result, the semiconductor integrated circuit made from the gate array method can readily satisfy versatile demands for not only memory functions but also improvements in data processing utilizing the memory function.

The inclusion of the switch circuit in the gate array unit, for selecting what is desired from the group of signal lines to be connected to the data register, means that the circuit arrangement for the selection of the aforementioned function is standardized to a certain extent and makes it possible to deal with the versatile demands for the memory function more quickly. Moreover, the provision of the standardized function block governing the solid function like that of the control means for controlling access to the memory cell in an area separated from that of the gate array unit beforehand saves any user the trouble of designing logical functions. Also, it shortens the time required to ultimately obtain the integrated circuit having the logical function selected by the user.

BRIEF DESCRIPTION OF THE DRAWINGS

Further objects, features and advantages of the present invention will become more clear upon the following detailed description of preferred embodiments as shown in the drawings, wherein.

DETAILED DESCRIPTION OF THE DRAWING

Figure 1:
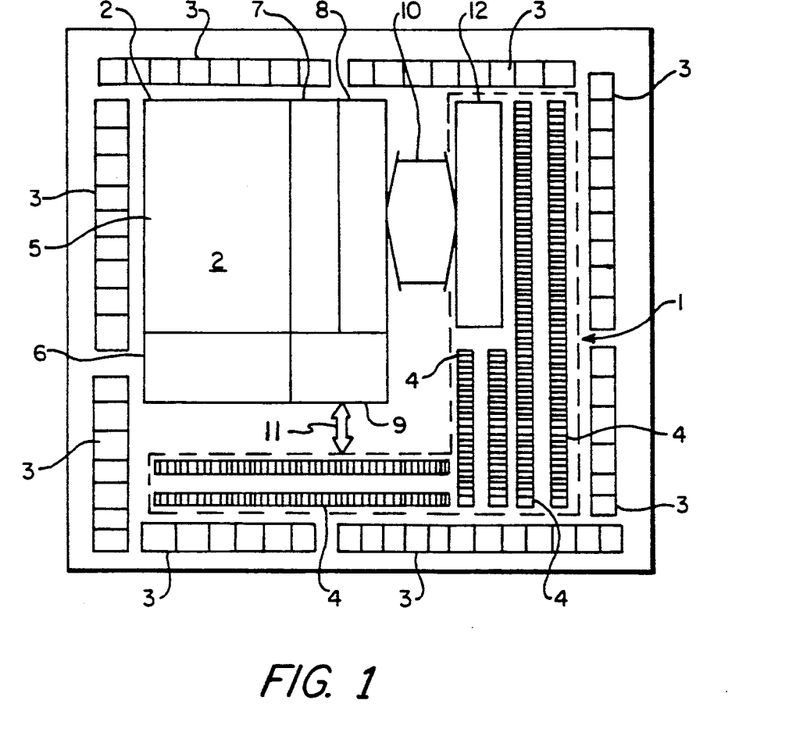
FIG. 1 is a block diagram of a semiconductor integrated circuit embodying the present invention.

FIG. 1 is a block diagram of a semiconductor integrated circuit embodying the present invention. The so-called gate array system is employed to form the semiconductor integrated circuit shown in FIG. 1 and the circuit is equipped with a gate array unit 1, a memory unit 2 and an input-output cell unit 3, which are formed on a semiconductor substrate of silicon or the like.

Figure 2A:
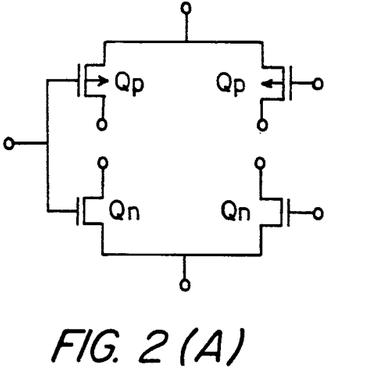
FIGS. 2A, 2B are examples of equivalent circuits before and after the provision of wiring on the basic cell in the gate array unit.
Figure 2B:
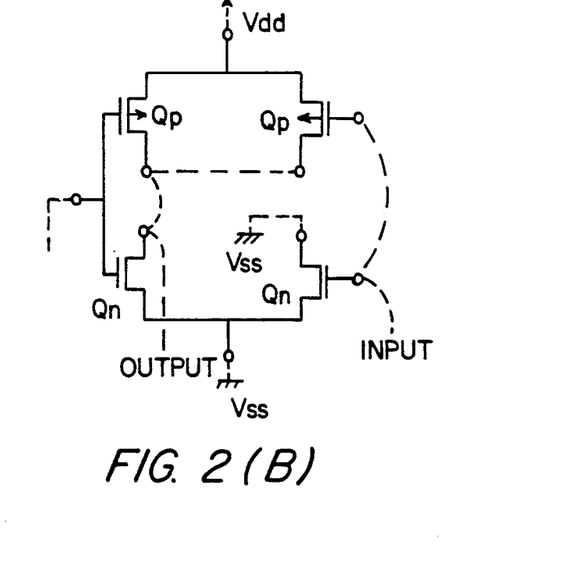

The gate array unit 1 has many basic cells 4 disposed methodically. Each of the basic cells 4 in the semiconductor integrated circuit is a complementary MOS circuit (CMOS) in this embodiment. For instance, each cell 4 has a pair of p-channel MOSFETs Qp and a pair of n-channel MOSTFETs Qn as shown by an equivalent circuit of FIG. 2A at the diffused wafer stage prior to the provision of wiring based on individual user specification. When the basic cell 4 shown in FIG. 2A is utilized as a 2-input NAND gate in accordance with the individual user specification, for instance, wiring shown by broken lines of FIG. 2B is furnished during the post-processing. The wiring process is performed by utilizing such an individual wiring mask forming a mask layer as to put the user demand specification into the gate array unit 1. The input-output cell unit 3 has individual bonding pads in order that input buffers, output buffers or input-output buffers may selectively be arranged by means of the wiring mask.

The memory unit 2, though not limited to a specific type, comprises a memory cell array 5 formed of a plurality of dynamic memory cells in the shape of a matrix, a combination of an X address decoder and a word driver 6 for selecting a word line of the memory cell array 5 to drive it, a sense amplifier array 7 for detecting and amplifying a complementary level appearing on a complementary bit line of the memory cell array 5, a data register 8 to be coupled to the complementary bit lines of the memory cell array 5, the data register being capable of storing data having bits corresponding to one word line of the memory cell array 5, and a timing controller 9. Unlike the gate array unit 1 whose circuitry is individually arranged in accordance with the user demand specification, this memory unit 2 is such that its circuitry is solidly determined and pre-standardized.

The data register 8, thus standardized in the memory unit 2, is coupled to the gate array 1 via a group of signal lines 10. The timing controller 9 is coupled to the gate array 1 via a group of signal lines 11. The groups of signal lines 11 are standardized as well. In the embodiment shown, the group of signal lines 10 in particular is connected to a switch circuit 12 included in the gate array unit 1. The switch circuit 12, though not limited to a specific type, is used to select specified ones from the group of signal lines 10. Although the switch circuit 12 is included in the gate array 1, the circuitry thereof is solidly determined and standardized.

Figure 3:
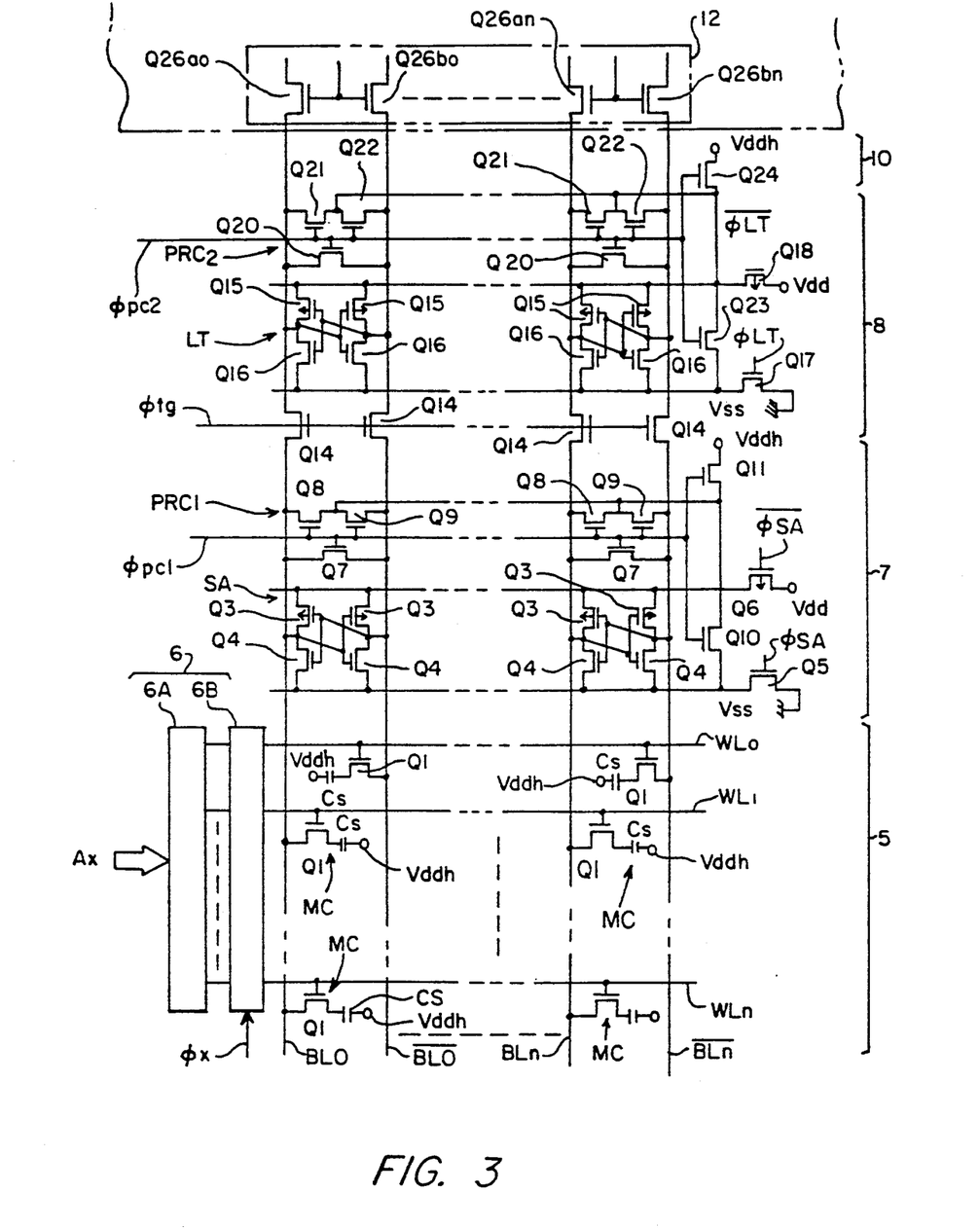
FIG. 3 shows a detailed configuration of the memory unit and the switch circuit included in the gate array unit.

FIG. 3 shows a detailed configuration of the memory unit 2 and the switch circuit 12.

Complementary bit lines BLo, $\overline{BLo}$-BLn, $\overline{BLn}$ of the memory cell array 5 in FIG. 3 are the aforementioned group of signal lines 10 and extended up to the switch circuit 12. Dynamic memory cells MC disposed in the form of a matrix in the memory cell array 5 have a one-transistor construction in which an n-channel (or p-channel) selective MOSFET Q1 and a stored capacitance Cs are connected in series. The memory cells equal in number are disposed along each of the parallel complementary bit lines, respectively. Their input-output terminals are coupled to the corresponding complementary bit lines alternately. Incidentally, the stored capacitance Cs of each memory cell MC, though not limited to a specific type, is coupled to a plate potential terminal Vddh loaded with a potential equivalent to half the potential of one power supply terminal Vdd in the circuit. Selective terminals of the memory cells MC are coupled to respective word lines WLo-WLn in the direction of lines perpendicular to the complementary bit lines BLo, $\overline{BLo}$-BLn, $\overline{BLn}$. The word lines WLo-WLn are coupled to respective output terminals of the word drivers 6B on a one-to-one basis. An output selective signal of an X address decoder 6A for decoding an X address signal Ax is supplied to the word driver 6B, Then the word line corresponding to the X address signal Ax is driven to a selective level.

The complementary bit lines BLo, $\overline{BLo}$-BLn, $\overline{BLn}$ have a so-called cyclical bit line construction. Each couples a precharge circuit $PRC_1$ to a sense amplifier SA thus forming sense amplifier array 7.

The sense amplifier SA, though not limited to a specific type, has cross-coupled input terminals and output terminals of a pair of CMOS inverters, each pair comprising a p-channel MOSFET Q3 and an n-channel MOSFET Q4 connected in series. The pair of input-output terminals are coupled to corresponding complementary bit lines separately. The common source electrodes of the MOSFETs Q4 are coupled via an n-channel power switch MOSFET Q5 to the grounding terminal Vss of the circuit. The common source electrodes of the MOSFETs Q3 are coupled via a p-channel power switch MOSFET Q6 to the power supply terminal Vdd. The power switch MOSFETs Q5, Q6 are controlled according to sense amplifier drive signals $\phi$SA, $\overline{\phi SA}$, respectively.

The precharge circuit $PRC_1$, though not limited to a specific type, comprises an n-channel equalizer MOSFET Q7 for shortcircuiting the corresponding complementary bit lines to equalize their levels to an intermediate level Vdd/2 of the power supply terminal Vdd by causing an on-operation at predetermined timing, during the non-access period of the memory cell array 5. N-channel precharge MOSFETs Q8, Q9 are capable of applying the voltage Vdd/2 to the pair of corresponding complementary lines in order to compensate for the leak current then existing. The path used to supply the voltage Vdd/2 for precharging the complementary bit line is in the form of including both the common source electrodes of the sense amplifiers SA. In other words, an n-channel transfer MOSFET Q10 is placed between both the common source electrodes of the sense amplifier SA. An n-channel power switch MOSFET Q11 is connected between the transfer MOSFET Q10 and the terminal Vddh for supplying the voltage Vdd/2. The power switch MOSFET Q11 and the transfer MOSFET Q10 are switched under control of a precharge signal $PRC_1$ in such a way that they are set at high levels during the non-access period of the memory cell array 5 and turned off at the driving timing of the sense amplifier SA. Prior to the initiation of the read/write operation, the precharge circuit $PRC_1$ precharges nodes of the complimentary bit line and the sense amplifier SA at a desired level. The precharge level is made a decision level at which the data is read from the memory cell.

When a desired memory cell is selected in such a state that the complementary bit lines BLo, $\overline{BLo}$-BLn, $\overline{BLn}$ are precharged by the precharge circuits $PRC_1$ at the voltage Vdd/2, a signal obtainable by redistributing the stored charge of the memory cell between the stored capacitance Cs and the bit line capacitance appears on one of the bit lines coupled to the data input-output terminal of the memory cell thus selected. Thus, there occurs a micro difference in potential between that voltage and Vdd/2 at the precharge level on the other bit line. When the sense amplifier SA is activated in that state, the sense amplifier SA detects the micro difference in potential and drives the complementary bit line up to the complementary level. At this time, the reachable level of one bit line that should have been set at low levels becomes equal to that of the common source voltage of the n-channel MOSFET Q4. The reachable level of the other bit line that should have been set at high levels conforms to that of the common source voltage of the p-channel MOSFET Q3. When data is written, the reachable level of the bit line determines the writing voltage. The charge corresponding in size to the writing voltage and the stored capacitance Cs is stored in the memory cell MC.

The data register array 8 has transfer gates formed with a n-channel transfer MOSFETs Q14 at a preceding stage, and latch circuits LT and precharge circuits $PRC_2$ at the following stage.

The latch circuit LT, though not limited to a specific type, has the substantially same construction as that of the sense amplifier SA. It is cross-coupled input terminals and output terminals of a pair of CMOS inverters, each pair comprising a p-channel MOSFET Q15 and an n-channel MOSFET Q16 connected in series. The pair of input-output terminals are coupled to corresponding complementary bit lines separately. The common source electrodes of the MOSFETs Q16 are coupled via an n-channel power switch MOSFET Q17 to the grounding terminal Vss of the circuit. The common source electrodes of the MOSFETs Q15 are coupled via a p-channel power switch MOSFET Q18 to the power supply terminal Vdd. The power switch MOSFETs Q17, Q18 are controlled according to latch control signals $\phi LT$, $\phi \overline{LT}$ respectively.

The precharge circuit $PRC_2$, though not limited to a specific type, comprises an n-channel equalizer MOSFET Q20 for short circuiting the corresponding complementary bit lines at the following stage of the transfer MOSFET Q14 to equalize their levels to an intermediate level Vdd/2 of the power supply terminal Vdd by causing an on-operation at predetermined timing prior to data latch timing in the data register array 8. N-channel precharge MOSFETs Q21 and Q22 are capable of applying the voltage Vdd/2 to the pair of corresponding complementary bit lines in order to compensate for the leak current. The path used to supply the voltage Vdd/2 for precharging the complementary bit line includes both the common source electrodes of the latch circuits LT. In other words, an n-channel transfer MOSFET Q23 is placed between both the common source electrodes of the latch circuit LT. An n-channel power switch MOSFET Q24 capable of supplying the voltage Vdd/2 is connected between the transfer MOSFET Q23 and the terminal Vddh. The power switch MOSFET Q24 and the transfer MOSFET Q23 are switched under control of a precharge signal $\phi pc_2$ in such a way that they are set at high levels during the predetermined period prior to the data latch timing in the data register array 8 and are turned off at the data latch timing of the latch circuit LT. Prior to latching data, the precharge circuit $PRC_2$ precharges nodes of the complimentary bit line positioned at the following stage of the transfer MOSFET Q14 and the latch circuit LT at a desired level beforehand in view of operation.

When the transfer MOSFET Q14 is turned on according to a transfer control signal $\phi tg$ while the complementary bit lines BLo, $\overline{BLo}$-BLn, $\overline{BLn}$ positioned at the following stage of the transfer MOSFET Q14 are precharged by the precharge circuit $PRC_2$ at the voltage Vdd/2, the data read from the memory cell array 5 to each of the respective bit lines BLo, $\overline{BLo}$-BLn, $\overline{BLn}$ is latched in each of the corresponding latch circuits LT. While the memory cell array 5 has been instructed to perform the writing operation, the data supplied from the gate array unit 1 to the data register array 8 is latched in the latch circuit LT. When the transfer MOSFET Q14 is subsequently turned on, the data latched in each of the latch circuits LT is written to the memory cell MC equivalent to one line connected with a word line to be selected then.

The aforementioned switch circuit 12 includes n-channel selective MOSFET Q26ao, Q26bo-Q26an, Q26bn joined in combination by the respective pairs of complementary bit lines BLo, $\overline{BLo}$-BLn, $\overline{BLn}$. Gate electrodes of MOSFET Q26ao, Q26bo-Q26an, Q26bn are connected on a common pair basis. The switch circuit 12 is thus standardized, though it is not limited to this arrangement. In this case, not only the connections of terminals that are made source/drain electrodes of selective MOSFET Q26ao, Q26bo-Q26an, Q26bn but also the supplying of selective signals to the gate electrodes of the respective MOSFETs are optionally determined, depending on the individual logical structure adopted in any other basic cell 4 in the gate array unit 1.

Figure 4A:
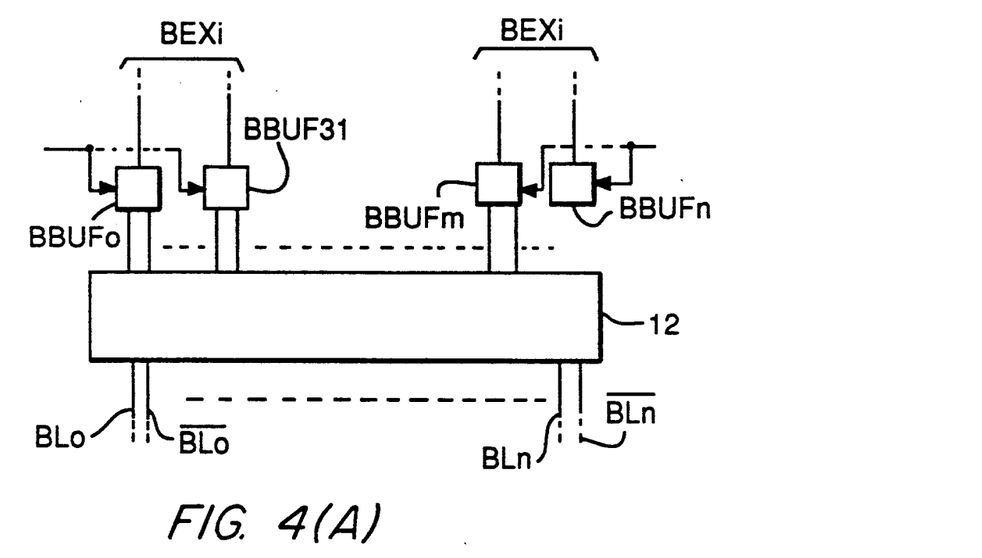
FIGS. 4A, 4B shown examples of the utilization of the switch circuit when the individual logical structure is employed for the gate array.
Figure 4B:
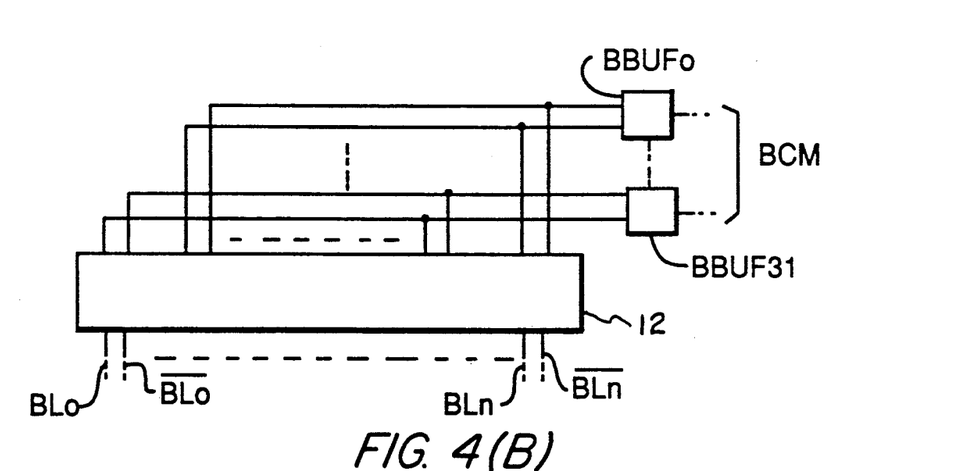

FIG. 4 shows an example of the utilization of the switch circuit 12 when the individual logical structure is employed for the gate array in accordance with user demand.

The example shown in FIG. 4A embodies individual interfaces between the bit lines BLo, $\overline{BLo}$-BLn, $\overline{BLn}$ and special buses $BEX_1$-BEXi having respective bits via bus buffers BBUFo-BBUFn. Assuming each of the special buses $EX_1$-BEXi has 32 bits, 32 combinations of bit lines and selective MOSFETs are reduced into one block. These blocks are connected to the corresponding special buses BEX$_1$-BEXi. In this case, the gate electrodes of the selective MOSFETs included in the switch circuit 12 may be switched under control of a common selective signal by the special buses BEX$_1$-BEXi. If the bit lines BLo, $\overline{BLo}$-BLn, $\overline{BLn}$ of the memory cell array 5 are individually connected to the corresponding special buses BEX$_1$-BEXi, it becomes possible to supply desired data in parallel to the circuit blocks coupled to the respective special buses BEX$_1$-BEXi. As a result, the memory unit 2 may be utilized to adopt such an arrangement for the gate array unit 1 to enable parallel processing of data equivalent to one word line of the memory cell array.

The example shown in FIG. 4B embodies selective interfaces between the bit lines BLo, $\overline{BLo}$-BLn, $\overline{BLn}$ and a common bus BCM as in the case of the ordinary memory. Assuming the common bus has 32 bits, for instance, 32 combinations of bus buffers BBUFo-BBUF$_{31}$ corresponding in bit length to the common bus BCM of 32 bits are coupled thereto and 32 pairs of selective MOSFETs included in the switch circuit 12 are commonly connected to the corresponding bus buffers. In this case, the gate electrodes of the selective MOSFETs included in the switch circuit 12 are made to correspond to the respective 32 bus buffers BBUFo-BBUF$_{31}$ so that the output selective signal of the address decoder, equipped with such an address decode logic as to select the 32 of selective MOSFETs on a block unit basis, may be used to exercise switch control. In other words, the switch circuit 12 functions as a so-called Y select circuit in an ordinary memory. With the adoption of the gate array 1 thus constructed, the memory unit 2 may be utilized as a memory capable of inputting/outputting data to/from the common bus BCM on a 32 bit basis.

Figure 5:
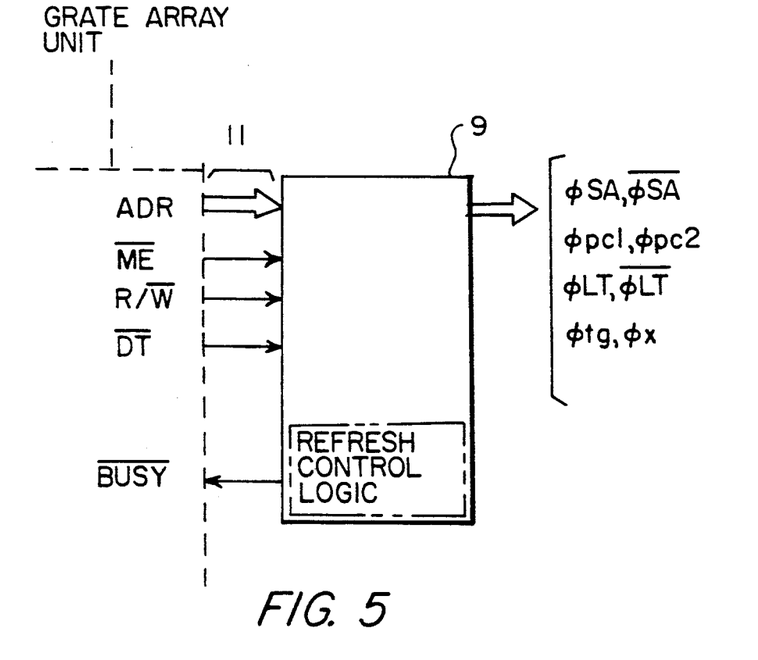
FIG. 5 is a diagram illustrative of a signal assigned to the signal line for connecting the timing controller to the gate array unit.
Figure 6:
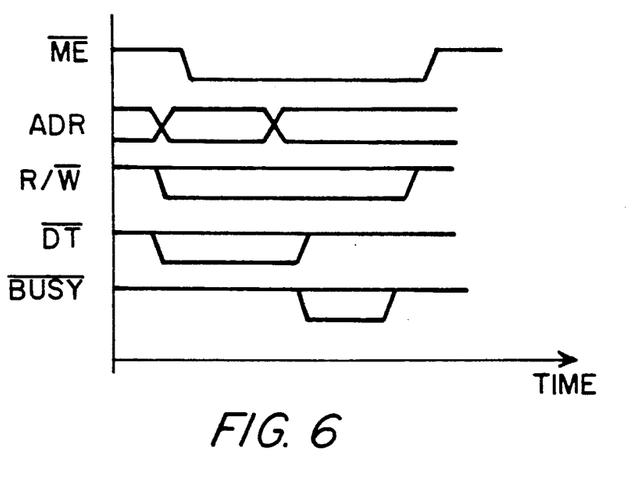
FIG. 6 shows an example of the timing at which the signals being exchanged between the gate array unit and the timing controller are changed.

The timing controller 9 operates, as shown in FIG. 3, in conformity with the logic of generating various internal control signals. The signals include the following:

sense amplifier drive signals $\phi$SA, $\overline{\phi SA}$ for activating the sense amplifier SA, precharge signals $\phi pc_1$, $\overline{\phi pa_1}$, latch control signals $\phi \overline{LT}$, for activating the latch circuits LT, transfer signals $\phi tg$ control signals $\phi x$ for activating the word driver 6B, etc., refresh control logic for generating internal control signals $\phi x$ necessary for controlling the designation of the refresh mode for refreshing the memory cell MC at predetermined timing, and the generation of the refresh address. The logical structure has been standardized solidly. The timing controller 9 is connected via the group of signal lines 11 to the gate array unit 1 as shown in FIG. 5. The group of signal lines 11, though not limited to a specific type, is preallocated to an address signal ADR, memory enable signal $\overline{MR}$ read/write signal R/$\overline{W}$, data transfer signal $\overline{DT}$ and busy signal $\overline{BUSY}$. Notwithstanding, the logic and circuit arrangement for generating those signals are individually determined in accordance with the logical structure and circuit arrangement adopted in the gate array unit 1. The memory enable signal $\overline{ME}$, though not limited to a specific type, is made a signal for designating access to the memory cell array 5 or data register array 8 because of its low level. A data transfer signal $\overline{DT}$ used to designate whether data transfer is made between the memory cell array 5 and the data register 8 or between the data register array 8 and the gate array unit 1. The data transfer signal $\overline{DT}$ with its low level designates the former. Data transfer direction is instructed by a read write signal R/$\overline{W}$. The signal $\overline{BUSY}$ is a signal asserted at the gate array unit 1 while the memory cell MC is being refreshed according to the refresh control logic. When the assertion of the $\overline{BUSY}$ signal and the access demand of the memory cell array 5 by the gate array unit 1 compete with each other, there may be adopted the logic of waiting for the initialization of access by making use of the $\overline{BUSY}$ signal on the part of the gate array unit 1. FIG. 6 shows an example of the timing at which the control and address signals being exchanged between the gate array unit 1 and the timing controller 9 are changed after the individual circuit arrangement is determined.

Figure 7:
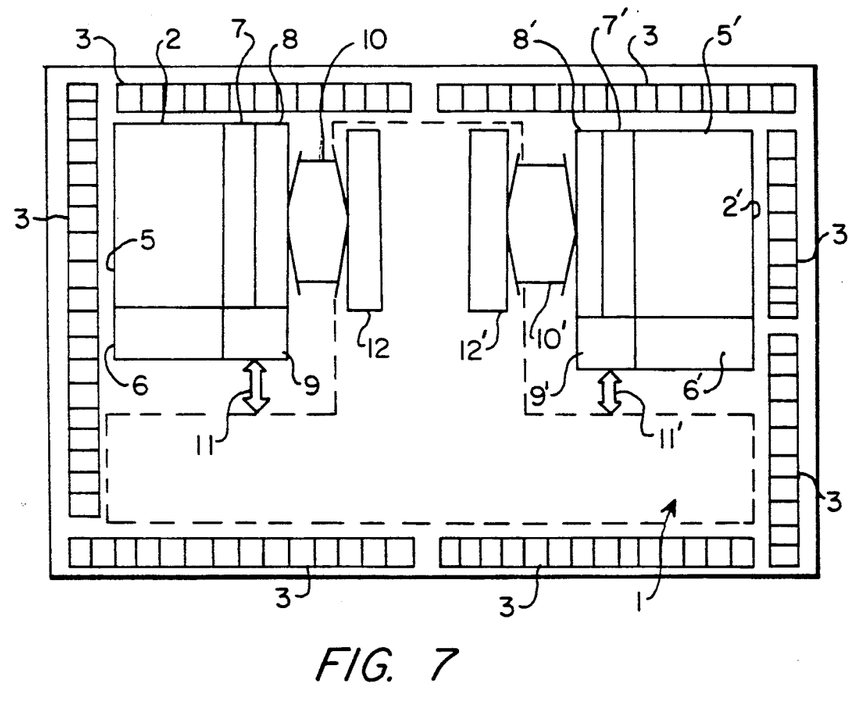
FIG. 7 is a block diagram of an embodiment wherein a plurality of memory units are provided.

FIG. 7 shows another example of a gate array semiconductor integrated circuit. The semiconductor integrated circuit shown in FIG. 7 is provided with a plurality of two memory units 2, 2' and they are respectively connected to the gate array unit 1 by means of standardized groups of signal lines 10', 11' as in the case of the foregoing embodiment.

Figure 8:
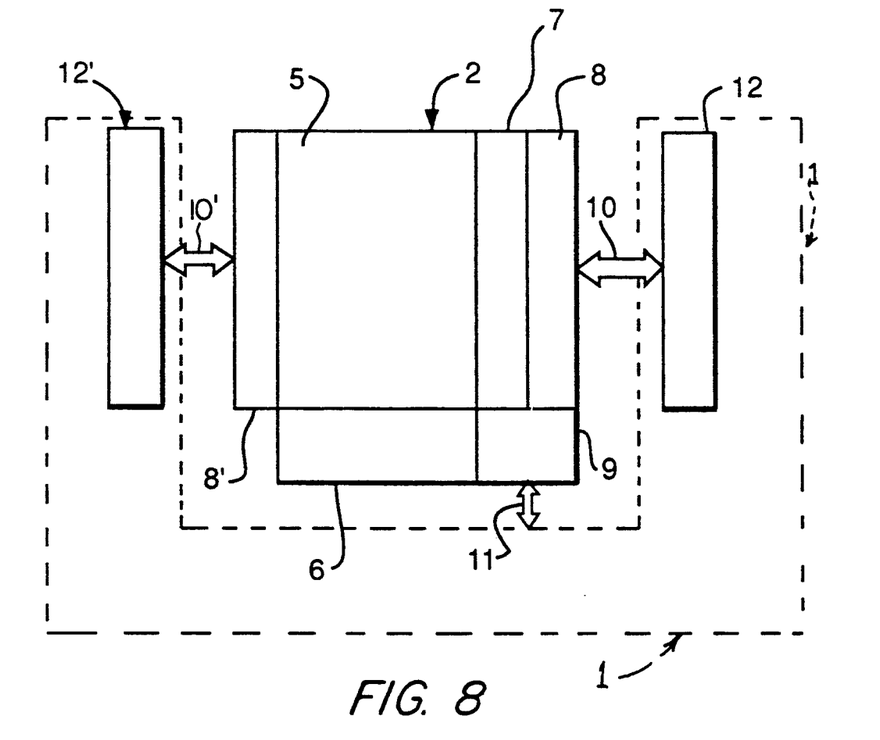
FIG. 8 is a block diagram of another embodiment of a semiconductor integrated circuit using the gate array method.

FIG. 8 shows another embodiment of a gate array semiconductor integrated circuit. The semiconductor integrated circuit shown in FIG. 8 has a plurality of data register arrays 8, 8' in the memory unit 2. These registers are respectively connected to the gate array unit 1 via a plurality of groups of signal lines 10, 10' and a plurality of switch circuits 12, 12'. The data registers 8, 8' may be connected to the same bit line or different ones, respectively.

Figure 9:
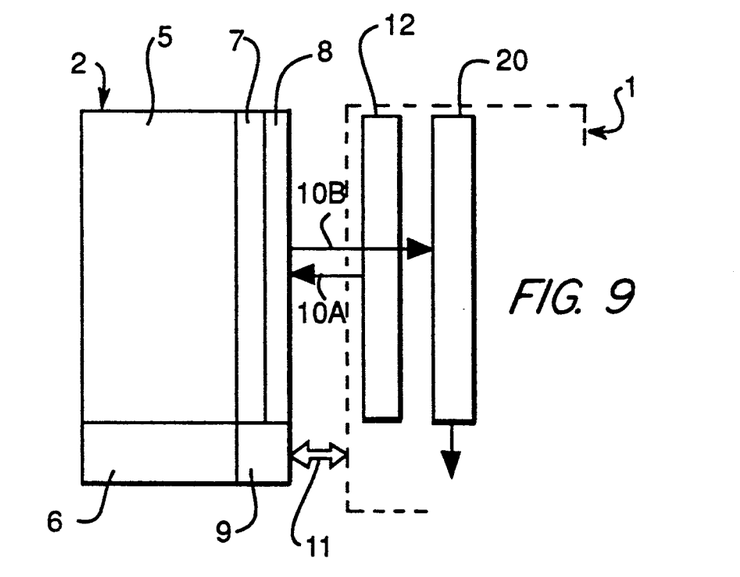
FIG. 9 is a block diagram of an embodiment of the present invention applied to a semiconductor integrated circuit using the gate array method for use in processing images.

FIG. 9 shows an embodiment of the present invention applied to a gate array semiconductor integrated circuit for use in processing images. The semiconductor integrated circuit has the standardized gate array unit 1 including a parallel-in-serial-out type shift register 20 coupled via a group of signal lines 10B to the data register 8. In addition, switch circuit 12 is coupled via a group of signal lines 10A to the data register 8. With this arrangement, the switch circuit 12 can be utilized as a random access port in the case of a video RAM having a dual port. The shift register 20 can be utilized as a serial port. In this case, the number of bits of image data writable simultaneously from the random access port via the switch circuit 12 in accordance with the logical structure or circuit arrangement adopted in the gate array unit 1 may be determined optionally.

This embodiment has the following effect:

(1) The data register 8 coupled to the bit lines BLo, $\overline{BLo}$-BLn, $\overline{BLn}$ of the memory cell array 5 and capable of storing data having bits completely or substantially corresponding to one word line of the memory cell array 5 is directly coupled via the group of signal lines 10 to the gate array unit 1 so as to form the semiconductor integrated circuit. The gate array unit 1 can therefore exchange data with the memory unit 2 in compliance with the individual logical structure required by means of the optional number of bits within the range of substantially one word line. Thus it becomes possible to increase the freedom of functional selection in that data, equivalent to substantially one word line of the memory cell array 5, is processed in parallel or partially in conformity with the individual function required for the gate array unit 1.

(2) With the foregoing functional effect, versatile demands for the memory function of the gate array semiconductor integrated circuit can readily be satisfied. At the same time, demands for improvement in data processing capability by making use of the memory function can also readily be satisfied.

(3) The foregoing effects (1) and (2) may also be obtained from the semiconductor integrated circuit having the solid structure formed of the memory cell array 5 and the data register 8 coupled to the bit lines BLo, BLo-BLn, BLn of the memory cell array 5 and capable of storing data having bits corresponding to substantially one word line of the memory cell array. The individual structure of the gate array unit 1 is coupled via the group of signal lines 10 to the data register 8.

(4) The formation of the standardized switch circuit 12, for selecting what is desired from the group of signal lines 10 connected to the data register 8, in the gate array unit 1 standardizes the circuit arrangement for use in optionally determining the mode of utilizing the data of the memory unit 2 of the gate array unit 1. Thus, versatile demands for the utilization mode of the memory unit 2 can be quickly dealt with.

(5) The formation of the functional block governing the solid function relative to the memory unit 2, such as the standardized timing controller 9, in an area different from the gate array unit 1 saves the user the trouble of logically designing the functional block. It also shortens the time required to provide such a semiconductor integrated circuit having the logical function selected by the user.

It is further understood by those skilled in the art that the foregoing description is a preferred embodiment of the disclosed device. Various changes and modifications may be made in the invention without departing from the spirit and the scope thereof.

Although the circuit arrangement in the embodiment shown includes the standardized switch circuit 12 and gate array unit 1, the circuit equivalent to the switch circuit 12 may be individually formed using the basic cells 4 of the gate array unit 1. When the switch circuit 12 is included in the gate array unit 1 in a standardized form, the circuit arrangement is not limited to what has been described in the embodiment above but may be in any other suitable form. Further, the mode of utilizing the switch circuit 12 included in the gate array unit 1 is not limited to what has been described in the embodiment shown but may be determined optionally. The timing controller 9 may logically be formed in the gate array unit 1 individually. More than two pairs of data registers to be connected to the same bit line may be provided solidly.

The basic cell of the gate array unit is not limited to the CMOS cell employed in the embodiment shown but may be of another type.

A logic module such as an arithmetic logical operator or shift register that may be required for the gate array unit may be included as a standard part.

Although a description has been given of the present invention of the semiconductor integrated circuit having the memory cell array equipped with the dynamic memory cells under the gate array method with the field of utilization as a background, the present invention is not limited to such an application but applicable to the manufacturing of a semiconductor integrated circuit equipped with a memory cell array including pseudo-static memory cells or static memory cells with the gate array. The present invention is applicable to such conditions under which a utilization mode is determined by at least the logical structure of the gate array or circuit arrangement of the memory unit.

The representative effects of the present invention disclosed in the present application will be summarized as follows:

Since the data register, coupled to the bit lines of the memory cell array and capable of storing data having bits completely or substantially corresponding to one word line of the memory cell array, is directly coupled via the group of signal lines to the gate array unit so as to form the semiconductor integrated circuit, the gate array unit can therefore exchange data with the memory unit in compliance with the individual logical structure required by means of the optional number of bits within the range of substantially one word line. Consequently, it becomes possible to increase the freedom of functional selection in that data equivalent to substantially one word line of the memory cell array is processed in parallel or partially in conformity with the individual function required for the gate array unit.

With the foregoing effect, versatile demands for the memory function by the gate array can readily be satisfied. At the same time, demands for improvement in data processing capability by making use of the memory function can also readily be satisfied.

The foregoing effects may also be obtained from the semiconductor integrated circuit having the solid structure formed of the memory cell array and the data register coupled to the bit lines of the memory cell array and capable of storing data having bits corresponding to substantially one word line of the memory cell array, and the individual structure of the gate array unit coupled via the group of signal lines to the data register. With the foregoing effect, versatile demands for the memory function can readily be satisfied. At the same time, demands for improvement in data processing capability by making use of the memory function can also readily be satisfied.

The formation of the standardized switch circuit for selecting what is desired from the group of signal lines connected to the data register in the gate array unit standardizes the circuit arrangement for use in optionally determining the mode of utilizing the data of the memory unit and of the gate array unit as much as possible, so that versatile demands for the utilization mode of the memory unit can be quickly dealt with.

The formation of the functional block governing the solid function relative to the memory unit such as the control means for controlling the access to the memory cell in a standardized form in an area different from the gate array unit saves the user the trouble of logically designing the functional block and also shortens the time required to provide such a semiconductor integrated circuit having the logical function selected by the user.

While a preferred embodiment has been set forth along with modifications and variations to show specific advantageous details of the present invention, further embodiments, modifications and variations are contemplated within the broader aspects of the present invention, all as set forth by the spirit and scope of the following claims.

I claim:

1. A gate array semiconductor single chip integrated circuit, comprising:
    a memory cell array having a plurality of word lines and a plurality of bit lines in matrix form;
    an x-address decoder for the word lines of said memory cell array and functioning as x-select means;
    a data register coupled to said memory cell array;
    a gate array unit having basic cells and being coupled to said data register;

application specific mask pattern layer means for wiring said basic cells in a specific application manner, including forming a part of y select means for providing selective signals;

sense amplifier means coupled between said memory cell array and said data register for detecting and amplifying particular signal levels on said bit lines of said memory cell array and passing amplified signals to said data register;

coupling means between said data register and said gate array unit, and said coupling means having a group of data signal lines corresponding to said bit lines;

switch circuit means coupled between basic cells of said gate array unit and said data register and responsive to the selective signals for selecting particular ones of said signal data lines to be used in the transfer of data between said data register and said gate array; and said switch circuit means and said gate array unit functioning as a y select circuit.

2. An integrated circuit according to claim 1, wherein said gate array unit basic cells each have a pair of p-channel MOSFETS and a pair of n-channel MOSFETs.

3. An integrated circuit according to claim 1, including a timing controller and a group of control lines coupling the timing controller and the gate array unit.

4. An integrated circuit according to claim 3, including a memory unit comprising said memory cell array, said sense amplifier means, said data register, said timing controller and x-address decoder and a word line driver between said x-address decoder and said memory cell array.

5. An integrated circuit according to claim 1, further including means, having said data register, for selectively storing data less than and equal to the bit length of a word line of said memory cell array.

6. An integrated circuit according to claim 1, wherein said memory cell array comprises a plurality of dynamic memory cells each having a FET and a capacitor connected in series.

7. An integrated circuit according to claim 1, wherein said gate array unit includes a shift register, coupled to said data register, so that said switch circuit means provides a random access port for operating said integrated circuit as a video RAM.

8. An integrated circuit according to claim 7, wherein said gate array unit basic cells each have a pair of p-channel MOSFETS and a pair of n-channel MOSFETS.

9. An integrated circuit according to claim 8,
including a memory unit comprising said memory cell array, said amplifier means, said data register, a timing controller, said x-address decoder and a word line driver between said x-address decoder and said memory cell array.

10. An integrated circuit according to claim 1, wherein said switch circuit means is formed in said gate array unit.

11. A method for producing a gate array semiconductor single chip integrated circuit, comprising the following steps performed on a single semiconductor chip:

forming a standardized memory cell array having a plurality of memory cells, bit lines and word lines in the form of a matrix;

forming an x-address decoder for the word lines of said memory cell array to function as x-select means;

forming a gate array unit having a group of unconnected basic cells;

forming a data register for the exchange of data between the gate array unit and the memory cell array;

forming data signal lines between the data register and the gate array unit; and wiring the basic cells of the gate array unit by using an application specific individual mask pattern providing only the wiring, thereby forming at least a part of y select means, and forming a switch circuit in the gate array unit for selecting particular ones of the data signal lines for data transfer as a further part of the y select means.

12. A method according to claim 11, including forming a plurality of input-output buffer cells on the semiconductor chip.

13. A method according to claim 12, wherein said steps of wiring includes wiring the input-output buffer cells with an application specific individual mask pattern to achieve desired input-output buffers cells.

14. A method according to claim 13, including repeating all of said steps with respect to a second chip to form two integrated circuit that are all identical except for the wiring, wherein said step of wiring employs at least two different mask patterns to form two individual semiconductor gate array integrated circuit devices having different functions respectively for said two integrated circuits.

15. A method according to claim 12, including repeating all of said steps with respect to a second chip to form two integrated circuits that are all identical except for the wiring, wherein said step of wiring employs at least two different mask patterns to form two individual semiconductor gate array integrated circuit devices having different functions respectively for said two integrated circuits.

16. A method according to claim 11, including coupling a sense amplifier between the memory cell array and the data register for detecting and amplifying particular signal levels of the memory cell array.

17. A method according to claim 16, including repeating all of said steps with respect to a second chip to form two integrated circuits that are all identical except for the wiring, wherein said step of wiring employs at least two different mask patterns to form two individual semiconductor gate array integrated circuit devices having different functions respectively for said two integrated circuits.

18. A method according to claim 11, including repeating all of said steps with respect to a second chip to form two integrated circuits that are all identical except for the wiring, wherein said step of wiring employs at least two different mask patterns to form two individual semiconductor gate array integrated circuit devices having different functions respectively for said two integrated circuits.

* * * * *